(12) United States Patent
Orman et al.

(10) Patent No.: US 11,680,864 B2
(45) Date of Patent: Jun. 20, 2023

(54) CONDITION MONITORING DEVICE AND METHOD FOR MONITORING AN ELECTRICAL MACHINE

(71) Applicant: ABB Schweiz AG, Baden (CH)

(72) Inventors: Maciej Orman, Radziszów (PL); Heqing Sun, Shanghai (CN); Prasad Venikar, Maharashtra (IN); Kavitha Ramasamy, Bangalore (IN)

(73) Assignee: ABB Schweiz AG, Baden (CH)

( * ) Notice: Subject to any disclaimer, the term of this patent is extended or adjusted under 35 U.S.C. 154(b) by 3 days.

(21) Appl. No.: 17/416,877

(22) PCT Filed: Nov. 26, 2019

(86) PCT No.: PCT/IB2019/060154
§ 371 (c)(1),
(2) Date: Jun. 21, 2021

(87) PCT Pub. No.: WO2020/128685
PCT Pub. Date: Jun. 25, 2020

(65) Prior Publication Data
US 2022/0034741 A1    Feb. 3, 2022

(30) Foreign Application Priority Data
Dec. 21, 2018 (IN) .............................. 201841048510

(51) Int. Cl.
*G01M 1/22* (2006.01)
*G01P 15/18* (2013.01)
(Continued)

(52) U.S. Cl.
CPC .............. *G01M 1/22* (2013.01); *G01P 15/18* (2013.01); *G01R 33/0206* (2013.01); *G05B 23/0259* (2013.01)

(58) Field of Classification Search
CPC ......... G01M 1/22; G01N 29/46; G01N 29/14; G01P 15/18; G05B 23/0259;
(Continued)

(56) References Cited

U.S. PATENT DOCUMENTS 5,852,351 A * 12/1998 Canada .................. H02K 11/35
702/56
6,199,018 B1    3/2001 Quist et al.
(Continued)

FOREIGN PATENT DOCUMENTS

EP        2824324 A1    1/2015
WO     2018109677 A1    6/2018

OTHER PUBLICATIONS

European Patent Office, International Search Report for PCT/IB2019/060154, dated Mar. 11, 2020, 3 pages.
(Continued)

*Primary Examiner* — Helen C Kwok
(74) *Attorney, Agent, or Firm* — Leydig, Voit & Mayer, Ltd.

(57) ABSTRACT

The present invention relates to a condition monitoring device and method for monitoring an electrical machine. The method includes obtaining, at periodic instants, measurements from sensors of the condition monitoring device, where each sensor is one of a magnetometer and an accelerometer. The method also includes comparing, for one or more instants, amplitude data of the measurements with condition monitoring data, wherein the comparison is performed for the amplitude data in one or more axes and at one or more frequencies. The condition monitoring data includes a relation between a plurality of parameters, a plurality of conditions and a plurality of frequencies. The method additionally includes detecting a condition and at least one parameter associated with the condition, based on the comparison. According to the detection, the method includes
(Continued)

utilizing the measurements of the at least one parameter for determining a health condition of the electrical machine.

15 Claims, 8 Drawing Sheets

(51) Int. Cl.
    *G01R 33/02* (2006.01)
    *G05B 23/02* (2006.01)
(58) Field of Classification Search
    CPC ............ G05B 23/0283; G05B 23/0235; G01R 33/0206; G01R 33/02
    See application file for complete search history.

(56) References Cited

U.S. PATENT DOCUMENTS

| | | | |
|---|---|---|---|
| 6,297,742 B1 | 10/2001 | Canada et al. | |
| 6,330,525 B1* | 12/2001 | Hays | F04D 15/0088 |
| | | | 702/182 |
| 6,434,512 B1 | 8/2002 | Discenzo | |
| 6,651,012 B1* | 11/2003 | Bechhoefer | G01N 29/46 |
| | | | 455/431 |
| 7,882,394 B2* | 2/2011 | Hosek | G06F 11/008 |
| | | | 714/48 |
| 9,913,006 B1* | 3/2018 | Wascat | H04W 4/80 |
| 2002/0138217 A1* | 9/2002 | Shen | G01H 1/003 |
| | | | 702/56 |
| 2006/0238332 A1* | 10/2006 | Carle | H04Q 9/00 |
| | | | 340/539.1 |
| 2009/0322373 A1* | 12/2009 | Dooley | G01R 31/343 |
| | | | 324/765.01 |
| 2015/0116131 A1 | 4/2015 | Ikeda et al. | |
| 2015/0346717 A1* | 12/2015 | Hosek | G06F 11/2257 |
| | | | 702/183 |
| 2015/0355044 A1* | 12/2015 | Cardinal | G01M 1/22 |
| | | | 73/455 |
| 2017/0074905 A1 | 3/2017 | Louzir et al. | |
| 2017/0082692 A1* | 3/2017 | Mulay | G01R 33/04 |
| 2018/0210427 A1* | 7/2018 | Cella | G06F 3/0488 |
| 2020/0182684 A1* | 6/2020 | Yoskovitz | G01V 3/081 |

OTHER PUBLICATIONS

European Patent Office, Written Opinion for PCT/IB2019/060154, dated Mar. 11, 2020, 8 pages.

Indian Patent Office, First Examination Report for IN201841048510, dated Mar. 8, 2021, 6 pages.

* cited by examiner

| SL.NO | X-AXIS | | | | | |
|---|---|---|---|---|---|---|
| | Speed | | | | | Flux |
| | fr | 2*fr | 3*fr | 4*fr | 5*fr | 2*fs |
| 1 | 149.7779 | 9.684064 | 55.35648 | 0 | 0 | 0 |
| 2 | 87.78277 | 26.41711 | 47.46404 | 46.90093 | 6.422713 | 255 |
| 3 | 54.02057 | 74.37228 | 61.02575 | 0 | 0 | 255 |
| 4 | 37.13991 | 136.5317 | 112.3898 | 59.30779 | 16.36884 | 246.3743 |
| 5 | 38.86447 | 160.4624 | 119.8124 | 49.26638 | 15.96327 | 255 |

FIGURE 5A

| SL.NO | Y-AXIS | | | | | |
|---|---|---|---|---|---|---|
| | Speed | | | | | Flux |
| | fr | 2*fr | 3*fr | 4*fr | 5*fr | 2*fs |
| 1 | 87.9613 | 204.0402 | 35.52398 | 0 | 0 | 0 |
| 2 | 5.100106 | 28.38111 | 21.90134 | 5.371854 | 1.258106 | 157.4588 |
| 3 | 5.212928 | 159.5287 | 8.2802 | 0 | 0 | 67.4698 |
| 4 | 4.24087 | 99.33137 | 28.74594 | 13.62745 | 4.396912 | 123.5027 |
| 5 | 2.191216 | 169.7217 | 30.14892 | 64.17956 | 8.317918 | 213.2405 |

FIGURE 5B

| SL.NO | Z-AXIS | | | | | Flux |
|---|---|---|---|---|---|---|
| | Speed | | | | | |
| | fr | 2*fr | 3*fr | 4*fr | 5*fr | 2*fs |
| 1 | 47.69114 | 100.8628 | 17.3908 | 0 | 0 | 0 |
| 2 | 35.59812 | 2.719826 | 16.75124 | 31.3449 | 3.204073 | 247.6035 |
| 3 | 2.042959 | 155.8041 | 11.63768 | 0 | 0 | 101.9878 |
| 4 | 4.683138 | 111.77 | 28.04156 | 40.86667 | 4.00367 | 170.3294 |
| 5 | 2.653608 | 132.2574 | 38.76864 | 60.74171 | 5.563272 | 255 |

FIGURE 5C

CONDITION MONITORING DEVICE AND METHOD FOR MONITORING AN ELECTRICAL MACHINE

CROSS-REFERENCE TO RELATED APPLICATIONS

This application is a U.S. national stage of International Application Serial No. PCT/IB2019/060154, filed Nov. 26, 2019, which claims priority to Indian Patent Application No. 201841048510, filed Dec. 21, 2018. The entire disclosures of both of the foregoing applications are incorporated herein by reference.

FIELD OF THE INVENTION

The present invention relates to the field of condition monitoring of electric machines, and more particularly, the present invention relates to detection and determination of faults using condition monitoring devices.

BACKGROUND OF THE INVENTION

Condition monitoring of electrical machines such as motors, generators, pumps, fans etc., typically involves detection of conditions requiring control, maintenance and/or other support, from the monitored parameters of the electrical machine. The monitoring of the electrical machine can be performed using sensors such as sensors to detect magnetic fields, currents, vibrations, temperatures etc. These sensors are usually part of a condition monitoring device, or the sensors provide signals to a condition monitoring device for condition assessment. Accordingly, condition monitoring devices essentially gather raw data from onboard sensors, or sensors connected to the electrical machine.

The analysis of the gathered data is performed either locally at the condition monitoring device using the local processor, or at a remote location, where the gathered data is transferred to a remote cloud for analysis. In both these approaches, there are limitations. Since the first approach is to acquire data and perform computations for condition assessment at the local end itself and transfer the results to the cloud or remote server (portal), computational capability is limited based on processor speed and memory restrictions of the device. Usually, the condition monitoring devices have limited processing speed and memory, and they can handle data for short periods (e.g. for 15-30 minutes). This restricts applicability from deploying advanced computational methods for analytics.

Similarly, since the second approach is to transfer the data from local end to the cloud (or remote server (portal)) and implement the logic for condition assessment on the cloud, the basic drawback is that a bulk of raw data is required to be transferred from the device to cloud. In a self-powered device (e.g. battery-operated condition monitoring device), this results in reduced operating life of the sensor. Also, communication consumes power and bandwidth. Therefore, it is desired to eliminate or minimize battery consumption, and optimize network usage for condition assessment.

Therefore, it is necessary to have a solution that overcomes drawbacks of these two approaches and at the same time offers improved methodology for further analytics.

SUMMARY OF THE INVENTION

The invention relates to monitoring an electrical machine such as a motor, with a condition monitoring device. The condition monitoring device is a device configured to be affixed on a housing of the electrical machine. Alternately, the condition monitoring device is a portable device that can be brought proximal to the electrical machine to detect health conditions of the electrical machine. The condition monitoring device can be a self-powered device, in which case it has an energy source such as one or more batteries.

In an aspect of the invention, the condition monitoring device comprises a housing, a plurality of sensors, a data logger, a memory, a data analyzer and a communication unit. These components are implemented as hardware or logical components. For example, there can be logic (stored as executable instructions in a memory), which is executable with a processor to perform various steps involved in monitoring of the electrical machine. Thus, the condition monitoring device includes a processor, sensors, memory, I/O interfaces and logic (e.g. logical modules), to perform various steps involved in monitoring of the electrical machine. Additionally, the condition monitoring device can include an energy source such as batteries, for powering the device.

The electrical machine can be monitored with the condition monitoring device. Alternately, the electrical machine can be monitored with the condition monitoring device and a computing device. Here, the computing device is one of an edge device (a gateway) or a server, which includes various techniques for detecting the health condition of the electrical machine. In this case, the computing device is communicatively coupled with the condition monitoring device over a plant communication network and receives the required measurements for the health assessment from the condition monitoring device.

In an aspect, the invention relates to a method for monitoring the electrical machine with the condition monitoring device. The method includes obtaining, at periodic instants, measurements from one or more sensors of the condition monitoring device. The condition monitoring device can be configured such that the sensors collect measurements every few minutes (e.g. in 5, 10, 15 or other predetermined time interval). Here, each sensor of the one or more sensors is one of a magnetometer and an accelerometer. Further, the measurements are performed in a plurality of axis and at a plurality of frequencies. Also, the measurements correspond to a measurement location determined based on a placement of the condition monitoring device relative to the electrical machine.

The method further includes comparing, for one or more instants (i.e. every time measurements are collected with the sensors, the data at that instant, or the data in that and some previous instants), amplitude data of the measurements with condition monitoring data available at the condition monitoring device. The condition monitoring data includes a relation between a plurality of parameters, a plurality of conditions and the plurality of frequencies. For example, the condition monitoring data includes a relation between rotor unbalance, misalignment, softfoot etc., accelerometer data corresponding to first five harmonics of estimated speed and/or magnetometer data corresponding to first two harmonics of line frequency. This can be a trend of data for data in certain axis, and certain frequencies. For instance, certain frequencies can be dominant in certain conditions, as an example data in axial direction may be dominant, as compared to data in tangential direction and so forth.

The comparison is performed for the amplitude data in one or more axis and at one or more frequencies. Thus, the comparison for the amplitude data is for the data in certain axis (e.g. axial direction, radial and/or tangential direction), and for certain frequencies (e.g. for first harmonic, second harmonic etc.).

For example, the measurements are performed with an accelerometer in three axis (e.g. using tri-axial accelerometer). Here, the comparison of the amplitude data in any axis is performed for the one or more frequencies corresponding to first three harmonics of speed estimated from the accelerometer measurements. The speed can be estimated from the accelerometer data using known techniques.

Taking another example, the measurements can be performed with an accelerometer and a magnetometer in three axes (e.g. using tri-axial accelerometer and tri-axial magnetometer). Here, the comparison of the amplitude data in any axis is performed for the one or more frequencies corresponding to one or more harmonics of speed and one or more harmonics of line frequency. Here, the speed is estimated using the measurements from both the accelerometer and the magnetometer, using known techniques. In accordance with the example, the amplitude data corresponding to three or more of first five harmonics of the estimated speed can be used for the accelerometer measurements, and the amplitude data corresponding to first and/or second harmonic of line frequency (supply frequency) can be used for the magnetometer measurements.

In accordance with the method, the comparison is performed for the amplitude data in one, two or three axes. This would depend on configuration for monitoring, and the relation between the parameters (magnetic field, flux, speed etc.), the condition and the frequencies (harmonics). Thus, the amplitude data in one or more axis and at one or more frequencies, is compared with the condition monitoring data. Accordingly, the method includes detecting a condition from the plurality of conditions, and at least one parameter associated with the condition, based on the comparison. Thus, for example a rotor unbalance or a shaft misalignment may be detected based on the comparison. Further, the corresponding parameter such as the magnetic field, flux, speed etc. is identified.

Consider the condition being one of a rotor unbalance and a shaft misalignment. The rotor unbalance is detected based on a comparison of the amplitude data (from accelerometer) in a first axis and corresponding to first two harmonics (of estimated speed), where the first axis is an axis parallel to the rotor. This can be detected as in the case of rotor unbalance, the amplitude data in the first harmonic is higher than the amplitude data in the second harmonic. Further, the difference between the two data depends on the severity of the condition.

The shaft misalignment is detected based on a comparison of the amplitude data in one or more axis of the plurality of axis and corresponding to second and third harmonics (of speed). This can be detected as in the case of shaft misalignment, the amplitude data in the second harmonic is higher than the amplitude data in the third harmonic for any axis.

The comparison of the measurements with the condition monitoring data can be utilized to detect one or more conditions. Accordingly, the method includes utilizing, in response to the detection, the measurements of the at least one parameter in the plurality of axis and at the plurality of frequencies. Thus, for the parameter(s) associated with the condition, all the data is utilized for determining a health condition of the electrical machine. Once the health condition is determined with the measurements of the at least one parameter, a suitable action can be undertaken. For example, an alert can be generated to schedule a maintenance and the alert can be communicated to an operator interface (e.g. a Human Machine Interface (HMI)).

The above method can be performed with the condition monitoring device, or as a distributed method, where some part of the method is performed with the condition monitoring device and remaining part of the method is performed with the computing device.

In either of the two implementations, the plurality of sensors include one or more of a magnetometer and an accelerometer (e.g. one magnetometer and one accelerometer). Here, each sensor is configured to perform measurements of one or more parameters (magnetic field, flux, vibration etc.) at periodic instants (e.g. in every few minutes). The measurements correspond to a measurement location determined based on a placement of the condition monitoring device relative to the electrical machine. Accordingly, if the condition monitoring device is affixed to the electrical machine (e.g. on a motor housing), the measurements correspond to that location on the electrical machine (depending on the sensor placement in the device housing). Alternately, when the condition monitoring device is a portable device, the measurements correspond to where the device is positioned for taking the measurements.

The data logger is configured to store the measurements collected with the plurality of sensors over a time period. The data logger can store the measurements in the memory, where the measurements are collected every few minutes, and the data can be stored for every half hour before deleting from the memory. The frequency of measurements, and the duration for which the measurements are retained depends on the configuration of the condition monitoring device.

The memory is configured to store the measurements (with the data logger), and also has the condition monitoring data. The memory also is accessible to the data analyzer for comparing, for one or more instants, the amplitude data of the measurements with the condition monitoring data to detect the condition.

The condition monitoring device may communicate the data to the computing unit (edge device or server). In which case, the communication unit transmits, in response to the detection, the measurements of the at least one parameter in the plurality of axis and at the plurality of frequencies. At the computing device, the measurements are utilized for determining a health condition of the electrical machine.

BRIEF DESCRIPTION OF THE DRAWINGS

The subject matter of the invention will be explained in more detail in the following text with reference to exemplary embodiments which are illustrated in the attached drawings, in which:

FIGS. 5A, 5B and 5C sample measurements of magnetic field and vibration, along the one or more axes at a plurality of time instants.

DETAILED DESCRIPTION

The invention overcomes the limitations of prior art approaches for monitoring electrical machines, where data gathered with sensors is analyzed either at local end or sent to a remote location for analytics.

To overcome these drawbacks, edge computing is utilized to reduce the dimensionality of the raw data. To extract more meaningful data from a local measurement unit, so called intermediate key performance indicators (KPI) are introduced. This is a set of values that are characteristic of measured signals, for example derived based on a physics-of-failure based approach of intermediate parameters.

The computation of KPIs representing physics-of-failure is simple and therefore can be performed on a microprocessor based on raw data collected from sensor(s). Dimensionality of the KPIs is far less than actual raw data and at the same time offers valuable insights useful for condition analysis or assessment. This also enables transmitting reduced data to a remote location (such as at a server). This precise information is useful for further advanced in-depth analysis by using computationally complex techniques, which cannot be performed at the microprocessor at the local end.

Additionally, trend data of these KPIs can be utilized, as against a single point measurement, which is commonly used in prior art. The trend offers insights in terms of variation of amplitudes of frequencies of interest. Such patterns can be analyzed for different directions of measurements, and for different frequencies (or harmonics) for improved understanding of the health of the electrical machine. The trend also eliminates a possibility of error which is possible in single point measurements.

Various faults in a machine behave in different ways for certain specific frequencies and specific directions of measurement. This physics-of-failure based approach of the invention based on the trend data can be used for analysis, identification and classification of the faults in an electrical machine.

The invention accordingly provides a method for condition monitoring of an electrical machine. The electrical machine may be one of several electrical machines in an industrial environment. The method is performed with a condition monitoring device associated with the electrical machine. The condition monitoring device may be a non-invasive condition monitoring device, or a part of a controller (e.g. drive) of the electrical machine.

Figure 1:
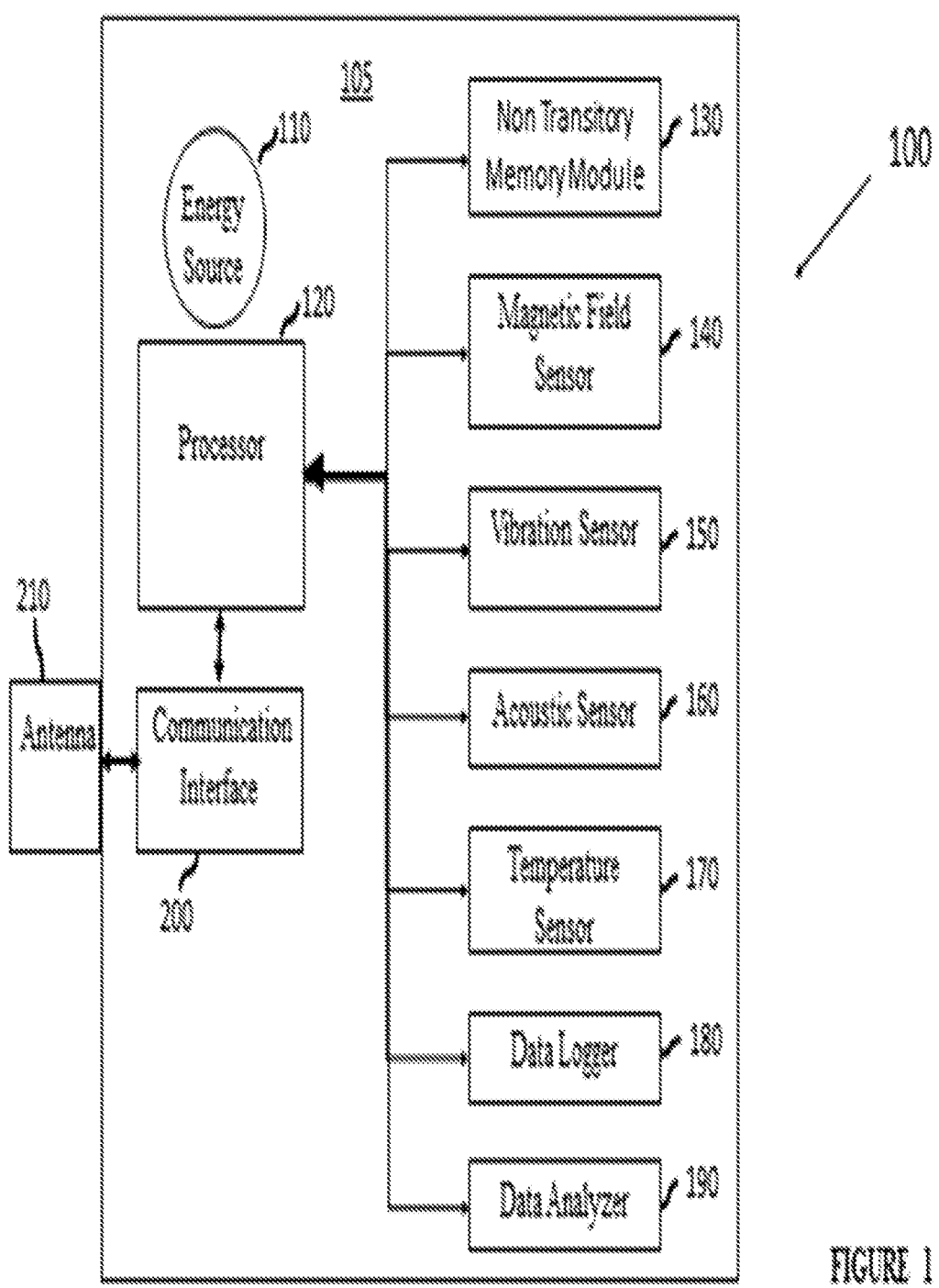
FIG. 1 illustrates a condition monitoring device, in accordance with an embodiment of the invention.
Figure 3:
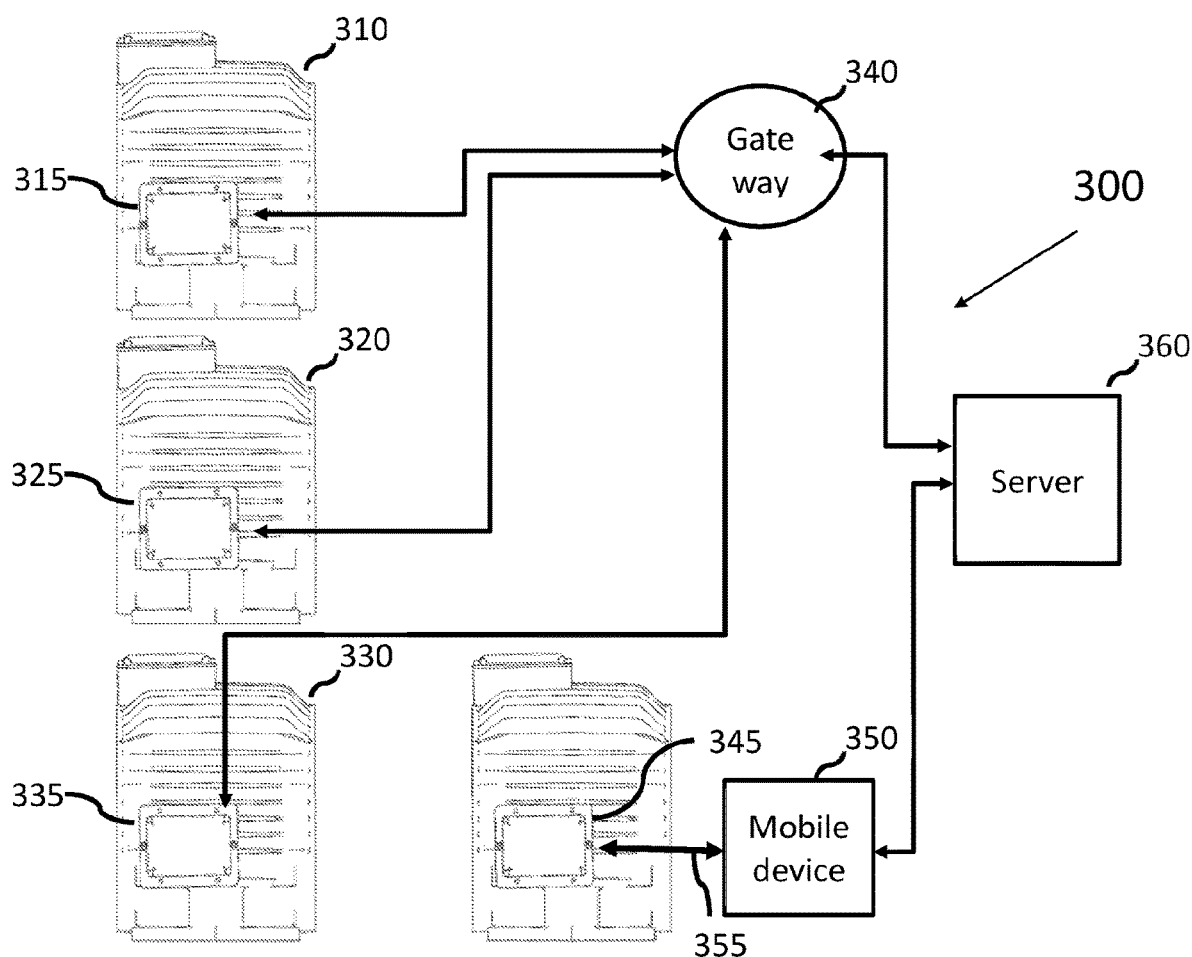
FIG. 3 illustrates a system for monitoring a plurality of electrical machines, in accordance with an embodiment of the invention.

A simplified representation of a condition monitoring device (100) is shown in FIG. 1. The condition monitoring device comprises a housing body (or housing) (105) capable of being affixed to a body, or shell, or frame of an electrical machine such as a motor (as shown in FIG. 3). The housing houses one or more sensors including, but not limited to, a magnetic field sensor (140), and a vibration sensor (150). The magnetic field sensor can be a magnetometer (e.g. a bi-axial or tri-axial magnetometer). Similarly, the vibration sensor can be an accelerometer (e.g. a bi-axial or tri-axial accelerometer).

There can be other sensors as well such as an acoustic sensor (160), and a temperature sensor (170). The one or more sensors are used to record and transmit measurement data. According to the positioning of the condition monitoring device relative to the electrical machine, the sensors of the condition monitoring device take measurements. Also, sensors take measurements in various axis such as for example in an axial, radial and/or tangential direction. Axial direction can be an axis that is parallel to a particular axis of the electrical machine (e.g. rotor axis), radial can be an axis perpendicular to the surface (e.g. housing surface), and so forth, and measurements in such different axis will be apparent to those skilled in the art. In addition, the sensors take measurements in discrete time instants. For example, the sensors can be performed measurements in every 5 minutes, 10 minutes, or other predetermined time intervals.

In accordance with the embodiment of FIG. 1, the condition monitoring device also includes a non-transitory memory module, or memory (130), for storing data as well as executable logic necessary for performing various steps involved in the condition monitoring of the electrical machine. In accordance with different embodiments, the memory includes condition monitoring data, which is utilized for the condition monitoring.

The condition monitoring data includes a relation between a plurality of parameters, a plurality of conditions and a plurality of frequencies. For example, the condition monitoring data includes a relation between rotor unbalance, misalignment, softfoot etc., accelerometer data corresponding to first five harmonics of estimated speed and/or magnetometer data corresponding to first two harmonics of line frequency (also referred as supply frequency).

As an example, the condition monitoring data has a mapping between rotor unbalance, and amplitude data from accelerometer in one axis (e.g. in an axial direction) in two frequencies, where rotor unbalance is detected as present when the amplitude data for one frequency (first harmonic), for some data points (e.g. 5 or 10 data points or data points corresponding to few minutes) is higher than the amplitude data in second frequency (second harmonic) by a threshold (e.g. one data being more than twice or thrice of the second etc.).

Such relations between the KPI (e.g. amplitude in certain frequencies and in specific directions), and the condition is determined beforehand and mapped, and this information is stored as part of the condition monitoring data. Thus, this can be used to detect the condition, and the parameter(s)—magnetic flux, vibration etc., that is associated with the condition. Then detailed information (or all information in certain time (last few minutes)) of the parameter(s) associated with the condition can be utilized for detailed analysis.

The condition monitoring device includes a data logger (180) that is configured to log or record the data collected with the various sensors of the device. The data can be stored in the memory, and such data can be retained in the memory for some time (e.g. 30 minutes, 1 hour or few hours). The condition monitoring device also includes a data analyzer (190) which is configured to perform various steps associated with detecting the condition (e.g. by comparing the data for some time with the condition monitoring data) and the associated parameter.

The data logger and the data analyzer can be modules which can be executed with one or more processors (e.g. 120). For example, these can be configured in the memory (although not shown in FIG. 1) of the condition monitoring device, where the modules are configured to be executed by the processor for performing one or more steps associated with the condition monitoring.

The processor itself may be a microprocessor configured to execute various steps involved in the condition monitoring. For example, the processor can have the data logger log measurements from the plurality of sensors, and the data analyzer determine one or more aspects of condition of the electrical machine.

Additionally, the condition monitoring device may include a communication unit with a network interface (200) configured for communication with an external device (e.g. an edge or gateway device, or a server such as a cloud or plant server). The network interface can be capable of communicating over wireless media such as Bluetooth, Wireless HART, etc. The network interface may communicate data using an antenna (210) as shown in FIG. 1.

The condition monitoring device may be a self-powered device, in which case it includes an energy source (110), housed in the housing body, for powering the one or more sensors, the one or more processors, and/or the network interface, as shown in FIG. 1. In an embodiment, an energy harvesting module (such as a thermoelectric generator, and the like or appropriately positioned capacitive/inductive sensors) is provided for harvesting power from at least one of leakage magnetic field of the electric machine, electric potential or current, and thermal energy of the electric machine, for charging the energy source.

The condition monitoring device may be mounted on a frame of the electrical machine for receiving measurements through sensors of the condition monitoring device. In such a scenario, according to their relative placements, the sensors send measurements to the processing unit, which can communicate the raw/processed data through the communication unit to an external device (e.g. a cloud-based server).

In the embodiment where the electrical machine is a motor, the condition monitoring device can be mounted on a surface of the motor that is close to the drive side to monitor the bearing, the rotor and the operating conditions of the motor.

In accordance with various embodiments of the invention, the condition monitoring device includes at least one vibration sensor, and it may also include at least one magnetic field sensor. In other words, there may be only an accelerometer, or both an accelerometer and a magnetometer. Accordingly, the measurements from the accelerometer and/or the magnetometer are obtained. These may be associated with parameters such as magnetic field, leakage magnetic flux, vibration etc. of the electrical machine. As mentioned, the measurements may be along one or more axes (parallel to an axis of a rotor of the electrical machine, at an angle (e.g. perpendicular, tangential etc. to the axis of the rotor etc.).

The measurements collected with the sensors in one or more axis (directions) and at one or more frequencies are utilized to determine various conditions and parameters associated with running of the electrical machine. In an embodiment, amplitude data of the measurements in one or more axis and at one or more frequencies are utilized to detect a condition. The condition can be one of a plurality of conditions such as, but not limited to, rotor unbalance, shaft misalignment, looseness and so forth.

Such information associated with a condition can serve as input for one or several estimation models at a remote location. For example, the condition can be linked with magnetic field, and the magnetometer data is sent to the computing device (gateway or server) for determining the root cause or predicting component failure etc. using a condition or life estimation model(s) at the computing device.

In case the condition monitoring device has superior processing and memory capabilities, models with limited capability may be configured in the device itself. Here, the models at the device can be updated with communication with the computing device (e.g. server).

The information associated with the parameter(s) associated with the condition, is used for predicting a condition requiring control, maintenance and/or other support. A communication to trigger an action (e.g. schedule a maintenance, performing a component replacement etc.) may be sent (e.g. through communication by server, through communication by condition monitoring device etc.) based on the prediction (or estimation).

Figure 2:
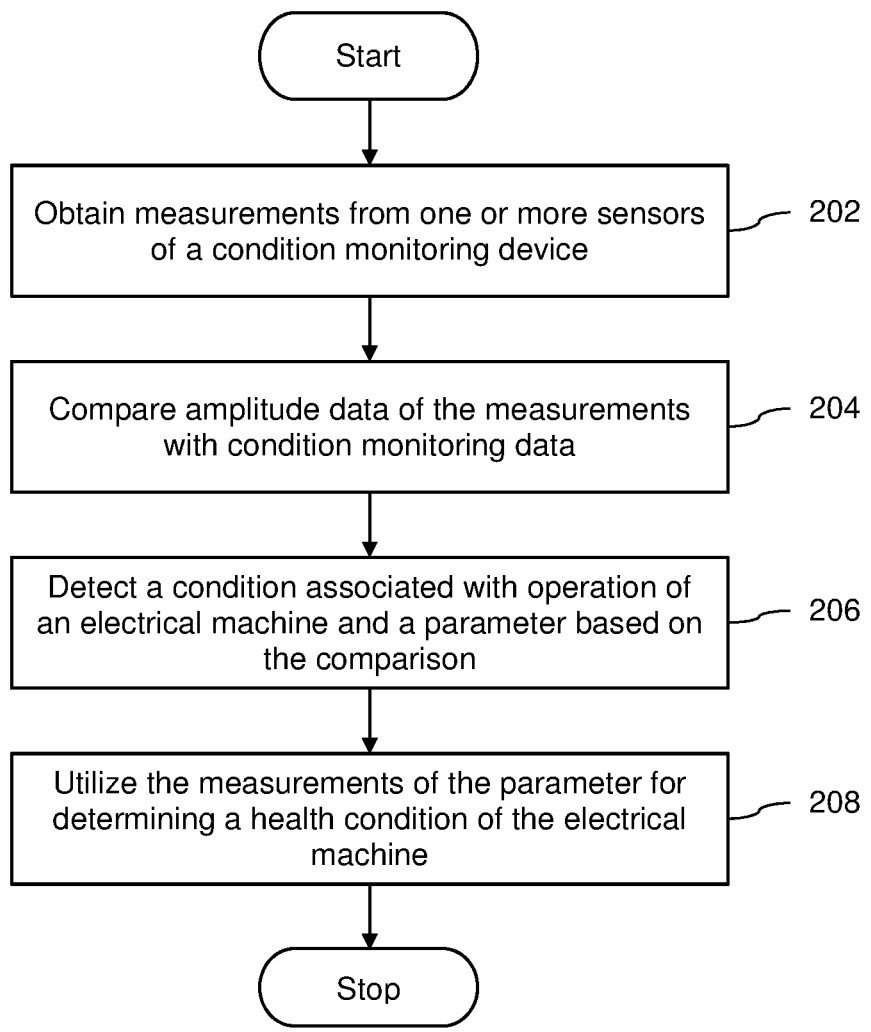
FIG. 2 is a flowchart of a method for monitoring an electrical machine, in accordance with an embodiment of the invention.

Moving now to FIG. 2, which is a flowchart of the method for monitoring the electrical machine, in accordance with an embodiment of the invention. The electrical machine may be an induction motor or other type of motor, typically present in an industrial environment such as a process plant.

The electrical machine may be one of a plurality of electrical machines (310, 320, 330 . . . ) monitored with a corresponding plurality of condition monitoring machines (315, 325, 335 . . . ) as shown in FIG. 3. Here, each condition monitoring device of the plurality of condition monitoring devices is associated with a corresponding electrical machine (i.e. 310, 320, 330 . . . ) of the plurality of electrical machines.

In the embodiment of FIG. 3, the plurality of condition monitoring devices are installed on the plurality of corresponding motors, for measuring one or more parameters associated with the corresponding motors in a non-invasive manner. For example, the parameters which can be measured include vibration, leakage magnetic flux, ultrasound around the motor, temperature around the motor, rotating speed of the shaft of the motor, etc.

The method at 202, includes obtaining, at periodic instants, measurements from one or more sensors of the condition monitoring device. For instance, the data logger can store the raw data gathered with the sensors in the memory. The condition monitoring device can be configured such that the sensors collect measurements every few minutes (e.g. in 5, 10, 15 or other predetermined time interval).

Figure 4:
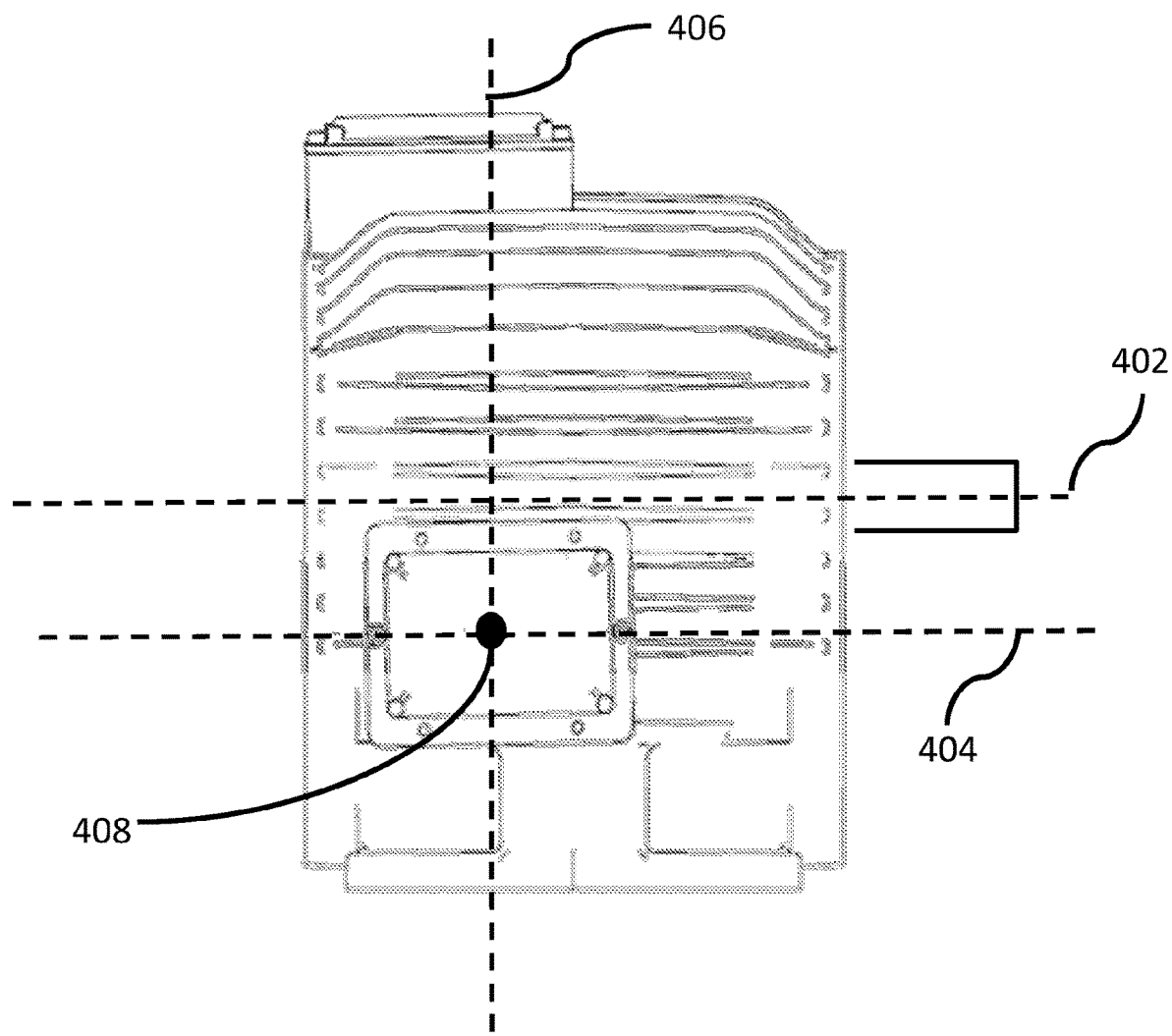
FIG. 4 illustrates one or more axes for measurements with the condition monitoring device, in accordance with an embodiment of the invention.

The measurements can be performed according to the placement of the condition monitoring device. For example, as shown in FIG. 4, the condition monitoring device is affixed on a housing of a motor, and the measurements can be performed at 404, 406 and 408. As can be seen axis 404 is parallel to the rotor axis (402), and axis 406 is tangential to the motor housing. Axis 408 (shown by dot) is perpendicular to 404 and 406 and can be considered radial direction for measurement. It would be apparent that the measurements would be at the sensor location, and it would depend on the position of the sensor in the housing.

FIGS. 5A to 5C show sample measurements collected with the sensors i.e. with an accelerometer and a magnetometer. The measurements shown include several data points for amplitude of speed and magnetic flux in three axes (x-axis, y-axis and z-axis). Here, the speed is calculated using either accelerometer measurements or using both accelerometer and magnetometer measurements. As can be seen the speed is estimated for five frequencies or harmonics (fr, 2fr, . . . 5fr) and the magnetic flux is estimated for the second harmonic (2fs) of the line frequency.

At 204, the method includes comparing, for one or more instants, the amplitude data of the measurements with condition monitoring data available at the condition monitoring device. For instance, the data analyzer can perform the comparison once the measurements are available. The comparison is performed for the amplitude data in one or more axis and at one or more frequencies. Thus, the comparison for the amplitude data is for the data in certain axis (e.g. axial direction, radial and/or tangential direction), and for certain frequencies (e.g. for first harmonic, second harmonic etc.).

At 206, the method includes detecting a condition from the plurality of conditions, and at least one parameter associated with the condition, based on the comparison. For instance, the data analyzer can detect the condition and the parameter based on the comparison.

Taking the tables of FIGS. 5A to 5C as example. The measurements at five instants (1, 2, 3 . . . 5) are collected. As soon as the first instant measurements are available, the data analyzer can compare the data. For example, the data analyzer can compare the amplitude data in fr and 2fr in the x-axis and based on the reference (i.e. condition monitoring data), it can detect unbalance for instant 1 and 2. As can be seen for the first two instances, amplitude data for fr is significantly higher than 2fr for rotor unbalance. Thus, the reference can be difference between amplitudes in fr and 2fr being greater than a threshold.

Similarly, taking another example, the data analyzer can compare the amplitude data in 2fr with that of any other fr (frequency or harmonic) in any axis, and based on the reference, it can detect parallel misalignment. As can be seen for the instances 3 to 5, amplitude data in 2fr is dominant indicating parallel misalignment. Thus, the reference can be how amplitude in 2fr is as compared to amplitudes in other frequencies or harmonics.

Taking other conditions, amplitude data in other frequencies and/or different axis may be dominant. For example, amplitude in second harmonic of line frequency (2fs) is dominant in softfoot, or in case of static electricity. Such information is mapped in the condition monitoring data, and the data analyzer is configured to compare actual data with the reference or the condition monitoring data, to detect the condition, and the corresponding parameter—i.e. magnetic flux, or vibration. For example, in case of rotor unbalance, axial measurements for accelerometer are needed, for softfoot magnetometer measurements are needed and so forth.

It is to be noted that the comparison may be performed for one or multiple instances. Having more data points increases the confidence of detecting the condition. For example, while at instance 1 (FIG. 5A) it is detected that rotor unbalance is present, having more instances such as another instant data (instance 2) confirms unbalance.

The comparison of the measurements with the condition monitoring data is utilized to detect one or more health conditions of the electrical machine. Accordingly, at 208, the method includes utilizing, in response to the detection, the measurements of the at least one parameter in the plurality of axis and at the plurality of frequencies. For example, complex analysis can be performed with the KPI (e.g. flux) measurements to predict a component failure.

Thus, for the parameter(s) associated with the condition, all the data is utilized for determining a health condition of the electrical machine. Once the health condition is determined with the measurements of the at least one parameter, a suitable action can be undertaken. For example, an alert can be generated to schedule a maintenance and the alert can be communicated to an operator interface (e.g. a Human Machine Interface (HMI)).

The above method is performed with the condition monitoring device and the computing device which can be an edge device (such as gateway 340) or a server (360) as shown in FIG. 3. As shown, the condition monitoring device can send the data to the computing device, where it can be utilized to perform complex analytics.

Thus, the method uses trend information, to detect commonly occurring faults. In one implementation, the method is used to detect misalignment and rotor unbalance. These two faults have specific response depending on the severity, which can be identified in the spectrum. However, instead of transferring all the data, KPI (such as speed or flux) are transferred for further analysis. The trend gives information related to gradual development of the fault and therefore necessary preventive actions can be planned based on trend data of these KPIs.

Figure 6:
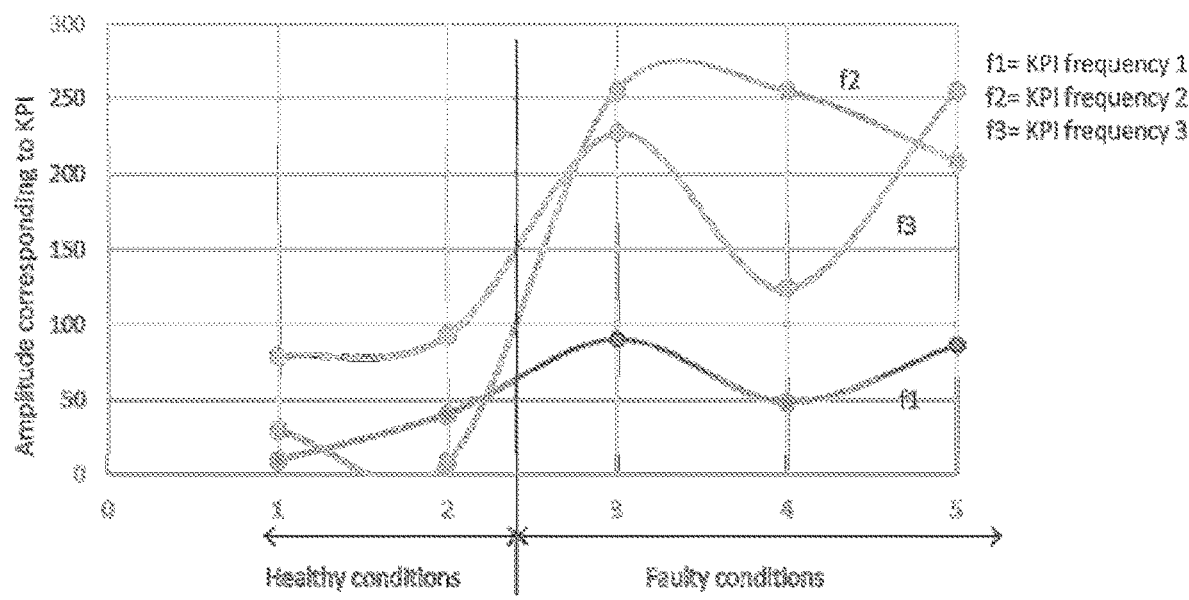
FIGS. 6 and 7 are sample plots showing rotor unbalance and parallel misalignment.

For example, FIG. 6 shows response of amplitude for KPI measured in axial direction for already known frequencies (f1, f2, and f3). This can be for different loads considering healthy and faulty conditions of parallel misalignment. As can be seen that relative increment in frequencies 2 and 3 is higher as against increase in frequency 1. This key information derived based on physic-of-failure approach comprising of the trend data improves the analysis. The KPI in case of FIG. 6 is speed, however it may also be flux.

Figure 7:
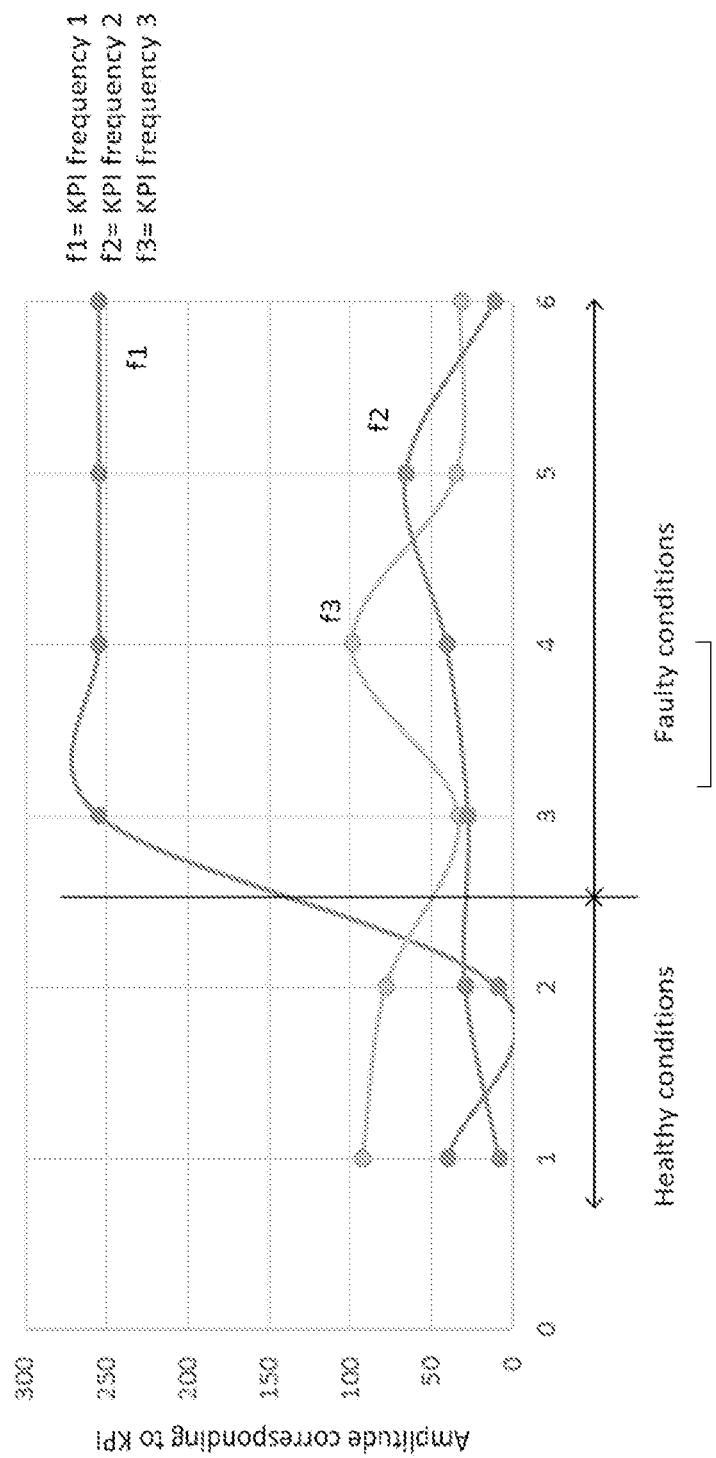

Another example for variation in trend data for rotor unbalance is presented in FIG. 7. In contrast to misalignment, in this case frequency 1 increases significantly as against increase in frequency 2 and 3 for same direction of measurement as used for previous case of misalignment.

These two examples are presented to provide an insight into the analytics capability of the information that can be derived from the amplitude trends of key frequencies of interest. The technique can also be extended for other faults as well and it is not restricted for these two alone. For instance, other kinds of faults such as structural looseness, angular misalignment, severe misalignment, bearing housing looseness, bent shaft etc. can also be similarly detected.

The invention offers huge market potential for deploying this approach on condition monitoring devices with limited battery storage. The proposed KPI derived based on physic-of-failure approach are key characteristics of the monitored device. Analyzing these meaningful parameters of trend data at server side with high computational capabilities provides valuable insights on the health of the electrical machine. Maintenance related activities can be performed well in advance to avoid catastrophic failures.

The physic-of-failure based approach to compute KPI locally and perform complex computations on this reduced data set transferred to the server at remote end proposed in this invention overcomes the drawbacks of existing methodologies. This enables reduced data transfer and optimizes battery requirement for communication. The bandwidth utilized for communication is also reduced as limited data is sent to the server. The data to be stored at server side is also less as compared to storing huge amount of raw data. Trend data obtained with this approach provides a tool for meaningful analysis to predict health of the machine. This trend data as against single point measurement is useful for advanced analytics that can be performed at the sever end based on optimized data reflecting useful information for condition of the machine being monitored.

We claim:

1. A method for monitoring an electrical machine with a condition monitoring device, the method comprising:
obtaining, at periodic instants, measurements from one or more sensors of the condition monitoring device, wherein each sensor of the one or more sensors is one of a magnetometer and an accelerometer, and wherein the measurements are performed in a plurality of axes and at a plurality of frequencies, and wherein the measurements correspond to a measurement location determined based on a placement of the condition monitoring device relative to the electrical machine;

comparing, for one or more instants, amplitude data of the measurements with condition monitoring data available at the condition monitoring device, wherein the comparison is performed for the amplitude data in one or more axes and at one or more frequencies, and wherein the condition monitoring data comprises a relation between a plurality of parameters, a plurality of conditions and the plurality of frequencies;

detecting a condition from the plurality of conditions, and at least one parameter associated with the condition, based on the comparison; and utilizing, in response to the detection, the measurements of the at least one parameter in the plurality of axes and at the plurality of frequencies, for determining a health condition of the electrical machine, wherein the health condition is determined with the measurements of the at least one parameter.

2. The method of claim 1, wherein the measurements are obtained with the accelerometer, and wherein the comparison of the amplitude data is performed for the one or more frequencies corresponding to first three harmonics of speed estimated from the accelerometer measurements.

3. The method of claim 1, wherein the measurements are obtained with the accelerometer and the magnetometer, and wherein the comparison of the amplitude data is performed for the one or more frequencies corresponding to one or more harmonics of speed and one or more harmonics of line frequency, wherein the speed is estimated using the measurements from at least one of the accelerometer and the magnetometer.

4. The method of claim 3, wherein the one or more frequencies compared for the amplitude data of the accelerometer correspond to three or more of first five harmonics of the estimated speed, and wherein the one or more frequencies compared for the amplitude data of the magnetometer correspond to first two harmonics of the line frequency.

5. The method of claim 1, wherein the condition is one of a rotor unbalance and a shaft misalignment,
wherein the rotor unbalance is detected based on a comparison of the amplitude data in a first axis and corresponding to first two harmonics, and wherein the first axis is an axis parallel to an unbalanced rotor, and
wherein the shaft misalignment is detected based on a comparison of the amplitude data in one or more axes of the plurality of axes and corresponding to second and third harmonics.

6. The method of claim 1, wherein the method is performed with one or more of the condition monitoring device and a computing device, wherein the computing device is one of an edge device and a server, and wherein the computing device is communicatively coupled with the condition monitoring device over a plant communication network.

7. A condition monitoring device for monitoring an electrical machine, the condition monitoring device comprising:
a housing;
a plurality of sensors arranged within the housing, with at least one magnetometer and at least one accelerometer, wherein each sensor is configured to perform measurements of one or more parameters at periodic instants, wherein the measurements correspond to a measurement location determined based on a placement of the condition monitoring device relative to the electrical machine;
a data logger configured to store the measurements collected with the plurality of sensors over a time period;
a memory with condition monitoring data, wherein the condition monitoring data comprises a relation between a plurality of parameters, a plurality of conditions and a plurality of frequencies;
a data analyzer configured to:
compare, for one or more instants, amplitude data of the measurements with the condition monitoring data, wherein the comparison is performed for the amplitude data in one or more axis and at one or more frequencies;
detect a condition from the plurality of conditions, and at least one parameter associated with the condition, based on the comparison; and a communication unit configured to transmit, in response to the detection, the measurements of the at least one parameter in a plurality of axes and at the plurality of frequencies, wherein the measurements are utilized for determining a health condition of the electrical machine.

8. The condition monitoring device of claim 7, wherein the electrical machine is an electric motor, and wherein the condition monitoring device is a self-powered device and comprises an energy source, and wherein the condition monitoring device is affixed on a housing of the electric motor.

9. The condition monitoring device of claim 8, wherein the condition monitoring device is affixed such that at least one of the sensors is placed to obtain measurements at an axis parallel to an axis of a rotor of the electric motor.

10. The condition monitoring device of claim 7, wherein at least one of the magnetometer and the accelerometer is a tri-axial sensor.

11. The method of claim 1, wherein the measurements are performed for at least two frequencies of the plurality of frequencies for each axis of the plurality of axes.

12. The method of claim 11, wherein each of the at least two frequencies correspond to a respective frequency associated with a performance indicator of the electrical machine.

13. The method of claim 1, wherein comparing, for one or more instants, amplitude data of the measurements with condition monitoring data available at the condition monitoring device further comprises:
mapping a first rotor unbalance frequency to a first frequency of the plurality of frequencies; and
comparing a difference between the first rotor unbalance frequency and the first frequency to a threshold difference, the threshold difference being available at the condition monitoring device.

14. The condition monitoring device of claim 7, wherein the measurements are performed for at least two frequencies of the plurality of frequencies for each axis of the plurality of axes.

15. The condition monitoring device of claim 7, wherein the communication unit is further configured to transmit the amplitude data of a subset of the condition monitoring data.

* * * * *